(12) United States Patent
Suuronen et al.

(10) Patent No.: US 8,268,081 B2
(45) Date of Patent: Sep. 18, 2012

(54) PLATEN CLEANING METHOD

(75) Inventors: David Suuronen, Newburyport, MA (US); Frederick B. Ammon, Essex, MA (US); David Burgdorf, Rockport, MA (US); Lyudmila Stone, Lynnfield, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 897 days.

(21) Appl. No.: 12/243,980

(22) Filed: Oct. 2, 2008

(65) Prior Publication Data

US 2010/0083980 A1    Apr. 8, 2010

(51) Int. Cl.
*B08B 3/04* (2006.01)
(52) U.S. Cl. .............. 134/1; 134/6; 134/8; 438/905; 427/523
(58) Field of Classification Search ............ 134/1, 1.1, 134/1.2; 438/905, 906; 427/523, 534
See application file for complete search history.

(56) References Cited

U.S. PATENT DOCUMENTS

| | | | | |
|---|---|---|---|---|
| 4,339,869 A | * | 7/1982 | Reihl et al. ............... | 438/526 |
| 4,764,394 A | * | 8/1988 | Conrad ..................... | 427/525 |
| 5,648,000 A | * | 7/1997 | Yamazaki et al. ......... | 216/67 |
| 5,945,681 A | * | 8/1999 | Tokiguchi et al. ........ | 250/492.21 |
| 6,027,988 A | * | 2/2000 | Cheung et al. ............ | 438/513 |
| 6,240,874 B1 | * | 6/2001 | Pike ......................... | 118/666 |
| 2004/0166612 A1 | * | 8/2004 | Maydan et al. ........... | 438/149 |
| 2006/0008660 A1 | * | 1/2006 | Parkhe ...................... | 428/446 |
| 2006/0112970 A1 | * | 6/2006 | Akiba ....................... | 134/1.1 |

* cited by examiner

*Primary Examiner* — Michael Barr
*Assistant Examiner* — Caitlin N Dunlap

(57) ABSTRACT

A method for cleaning a workpiece support that includes using a workpiece that has been coated on its bottom surface with a suitable material is disclosed. This specially coated workpiece is placed on the support, and some time later, it is removed, taking with it particles from the support. In certain embodiments, the workpiece undergoes an ion implantation process to increase its temperature, and to increase the tackiness of the coating on the bottom surface. The material used to coat the bottom can be of variable types, including photoresists, oxides and deposited glasses.

7 Claims, 2 Drawing Sheets

PLATEN CLEANING METHOD

BACKGROUND OF THE INVENTION

Ion implanters are commonly used in the production of semiconductor wafers. In some embodiments, an ion source is used to create an ion beam, which is then directed toward the wafer. As the ions strike the wafer, they dope a particular region of the wafer. The configuration of doped regions defines their functionality, and through the use of conductive interconnects, these wafers can be transformed into complex circuits. In other embodiments, ion implantation is performed by exposing a wafer directly to a plasma, a technique called "plasma immersion implantation."

A block diagram of a representative ion implanter 100 is shown in FIG. 1. An ion source 110 generates ions of a desired species. In some embodiments, these species are atomic ions, which may be best suited for high implant energies. In other embodiments, these species are molecular ions, which may be better suited for low implant energies. These ions are formed into a beam, which then passes through a source filter 120. The source filter is preferably located near the ion source. The ions within the beam are accelerated/decelerated in column 130 to the desired energy level. A mass analyzer magnet 140, having an aperture 145, is used to remove unwanted components from the ion beam, resulting in an ion beam 150 having the desired energy and mass characteristics passing through resolving aperture 145.

In certain embodiments, the ion beam 150 is a spot beam. In this scenario, the ion beam passes through a scanner 160, which can be either an electrostatic or magnetic scanner, which deflects the ion beam 150 to produce a scanned beam 155-157. In certain embodiments, the scanner 160 comprises separated scan plates in communication with a scan generator. The scan generator creates a scan voltage waveform, such as a sine, sawtooth or triangle waveform having amplitude and frequency components, which is applied to the scan plates. In a preferred embodiment, the scanning waveform is typically very close to being a triangle wave (constant slope), so as to leave the scanned beam at every position for nearly the same amount of time. Deviations from the triangle are used to make the beam uniform. The resultant electric field causes the ion beam to diverge as shown in FIG. 1.

In an alternate embodiment, the ion beam 150 is a ribbon beam. In such an embodiment, there is no need for a scanner, so the ribbon beam is already properly shaped.

An angle corrector 170 is adapted to deflect the divergent ion beamlets 155-157 into a set of beamlets having substantially parallel trajectories. Preferably, the angle corrector 170 comprises a magnet coil and magnetic pole pieces that are spaced apart to form a gap, through which the ion beamlets pass. The coil is energized so as to create a magnetic field within the gap, which deflects the ion beamlets in accordance with the strength and direction of the applied magnetic field. The magnetic field is adjusted by varying the current through the magnet coil. Alternatively, other structures, such as parallelizing lenses, can also be utilized to perform this function.

Following the angle corrector 170, the scanned beam is targeted toward the workpiece 175. The workpiece is attached to a workpiece support. The workpiece support provides a variety of degrees of movement.

An alternative embodiment of an ion implantation system, plasma immersion, is shown in FIG. 2. The plasma doping system 200 includes a process chamber 202 defining an enclosed volume 203. A platen 234 may be positioned in the process chamber 202 to support a workpiece 238. In one instance, the workpiece 238 may be a semiconductor wafer having a disk shape, such as, in one embodiment, a 300 millimeter (mm) diameter silicon wafer. The workpiece 238 may be clamped to a flat surface of the platen 234 by electrostatic or mechanical forces. In one embodiment, the platen 234 may include conductive pins (not shown) for making connection to the workpiece 238.

A gas source (not shown) provides a dopant gas to the interior volume 103 of the process chamber 202. A gas baffle 270 is positioned in the process chamber 202 to deflect the flow of gas from the gas source. A pressure gauge (not shown) measures the pressure inside the process chamber 202. A vacuum pump 212 evacuates exhausts from the process chamber 202 through an exhaust port 210 in the process chamber 202. An exhaust valve 214 controls the exhaust conductance through the exhaust port 210.

The process chamber 202 may have a chamber top 218 that includes a first section 220 formed of a dielectric material that extends in a generally horizontal direction. The chamber top 218 also includes a second section 222 formed of a dielectric material that extends a height from the first section 220 in a generally vertical direction. The chamber top 218 further includes a lid 224 formed of an electrically and thermally conductive material that extends across the second section 222 in a horizontal direction.

The plasma doping system may further include a source 201 configured to generate a plasma 240 within the process chamber 202. The source 201 may include a RF source 250, such as a power supply, to supply RF power to either one or both of the planar antenna 226 and the helical antenna 246 to generate the plasma 240. The RF source 250 may be coupled to the antennas 226, 246 by an impedance matching network 252 that matches the output impedance of the RF source 250 to the impedance of the RF antennas 226, 246 in order to maximize the power transferred from the RF source 250 to the RF antennas 226, 246.

The plasma doping system 200 also may include a bias power supply 248 electrically coupled to the platen 234. The bias power supply 248 is configured to provide a pulsed platen signal having pulse ON and OFF time periods to bias the platen 234, and, hence, the workpiece 238, and to accelerate ions from the plasma 240 toward the workpiece 238 during the pulse ON time periods and not during the pulse OFF periods. The bias power supply 248 may be a DC or an RF power supply.

In operation, the gas source (not shown) supplies a primary dopant gas containing a desired dopant for implantation into the workpiece 238. A gas pressure controller regulates the rate at which the primary dopant gas is supplied to the process chamber 202. The source 201 is configured to generate the plasma 240 within the process chamber 202. To generate the plasma 240, the RF source 250 resonates RF currents in at least one of the RF antennas 226, 246 to produce an oscillating magnetic field. The oscillating magnetic field induces RF currents into the process chamber 202. The RF currents in the process chamber 202 excite and ionize the primary dopant gas to generate the plasma 240.

The bias power supply 248 provides a pulsed platen signal to bias the platen 234 and, hence, the workpiece 238 to accelerate ions from the plasma 240 toward the workpiece 238 during the pulse ON periods of the pulsed platen signal. The frequency of the pulsed platen signal and/or the duty cycle of the pulses may be selected to provide a desired dose rate. The amplitude of the pulsed platen signal may be selected to provide a desired energy. With all other parameters being equal, a greater energy will result in a greater implanted depth.

The workpiece support is used to both hold the wafer in position, and to orient the wafer so as to be properly implanted by the ion beam or by plasma immersion. To effectively hold the wafer in place, most workpiece supports typically use a circular surface on which the workpiece rests, known as a platen. Often, the platen uses electrostatic force to hold the workpiece in position. By creating a strong electrostatic force on the platen, also known as the electrostatic chuck, the workpiece or wafer can be held in place without any mechanical fastening devices. This minimizes contamination and also improves cycle time, since the wafer does not need to be unfastened after it has been implanted. These chucks typically use one of two types of force to hold the wafer in place: coulombic or Johnsen-Rahbek force.

The equipment described above is typically located within a very low pressure, preferably a near vacuum, environment. Workpieces, such as wafers, are introduced into the vacuum environment via a FOUP (Front Opening Unified Pod). Each wafer is placed on the workpiece support, implanted with ions and then removed from the environment.

Large numbers of wafers are processed in this manner. The high throughput of wafers introduces particles into the workpiece environment, and specifically onto the workpiece support. While these particles are very small, usually in the 0.09 to 2 micron in diameter, they can still negatively impact the implantation process. In particular, particles accumulated on the platen can be transferred to the back of the wafer. While no devices are constructed on the back of the wafer, nevertheless these backside particles have two adverse effects on future process steps. Firstly, backside particles on one wafer may transfer to the frontside of a neighboring wafer in any batch process, or even in the FOUP. Secondly, larger backside particles (0.5 to 2 micron) elevate a local portion of the wafer above the plane of focus during lithography causing misfocus and hence yield loss through poor pattern definition.

Thus, it is customary to periodically clean the workpiece support. This procedure typically entails venting the chamber so that it returns to normal atmospheric pressure, then cleaning the workpiece support. This cleaning process may be mechanical in nature, such as rubbing the support, or may be chemical, such as using a mist spray. The chamber is then returned to vacuum conditions and the ion implantation process can proceed.

Unfortunately, this procedure is very time consuming, often taking hours of valuable time to return the process chamber to vacuum conditions. During this recovery time, the chamber is idle, thereby lowering the efficiency of the system, and increasing cost of ownership. Furthermore, exposure of the process chamber to atmosphere has other undesirable effects: moisture in the air can delaminate built-up films on the process chamber walls and other surfaces, which generates flaking and leads to frontside particles. Thus, venting the process chamber indirectly leads to longer recovery time than the vent and pump processes alone.

A method of cleaning the workpiece support which does not require the long recovery times associated with present day cleaning procedures would be extremely beneficial.

SUMMARY OF THE INVENTION

The problems of the prior art are overcome by the workpiece support cleaning method described in the present disclosure. The disclosure provides a method for cleaning a workpiece support, such as a platen, that includes using a workpiece, such as a semiconductor wafer, that has been coated on its bottom surface with a material suitable for removing particles from the workpiece support. This workpiece is placed on the support, and some time later, it is removed, taking with it particles from the support. In certain embodiments, the workpiece undergoes a process such as, but not limited to ion implantation, to increase its temperature and to increase the tackiness of the coating material on the bottom surface. The material used to coat the bottom can be of variable types, including photoresists, oxides and deposited glasses.

DETAILED DESCRIPTION OF THE INVENTION

Figure 1:
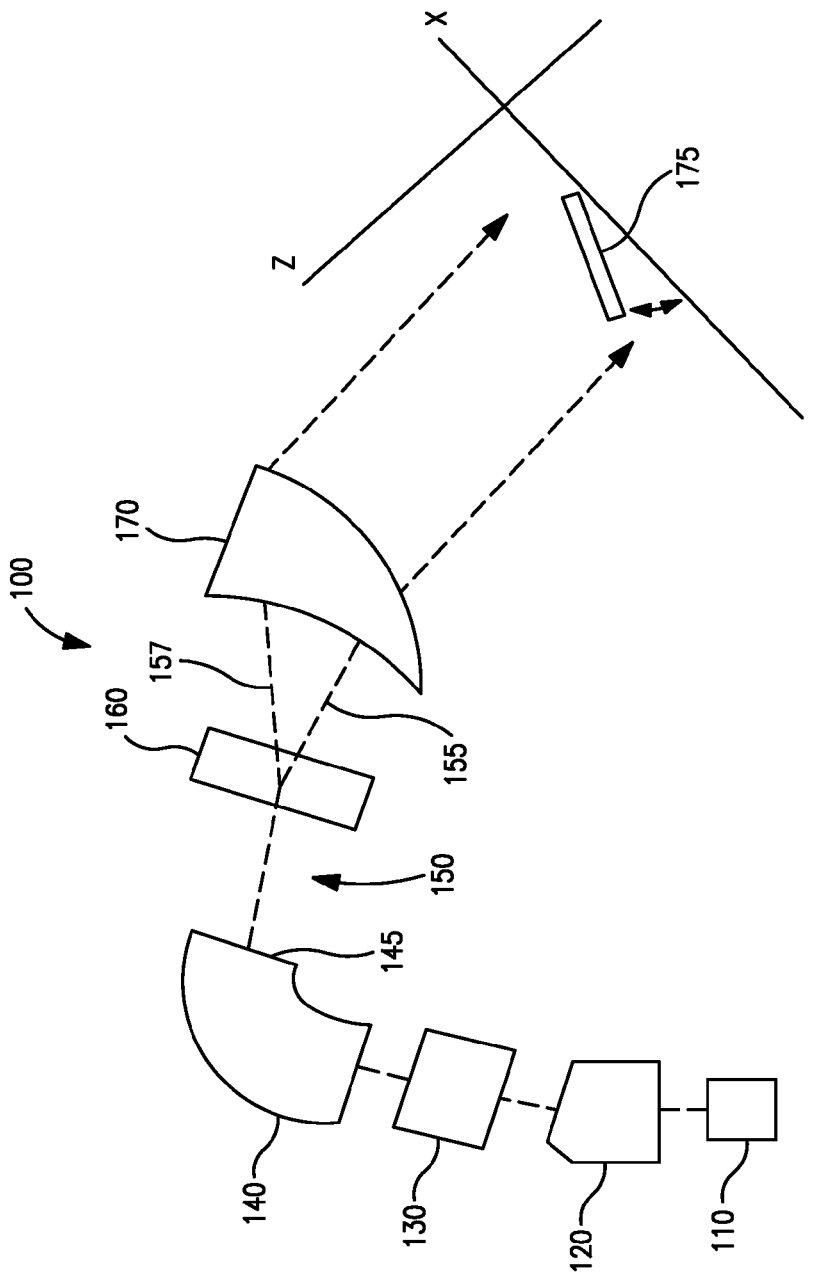
FIG. 1 represents a traditional ion implanter.
Figure 2:
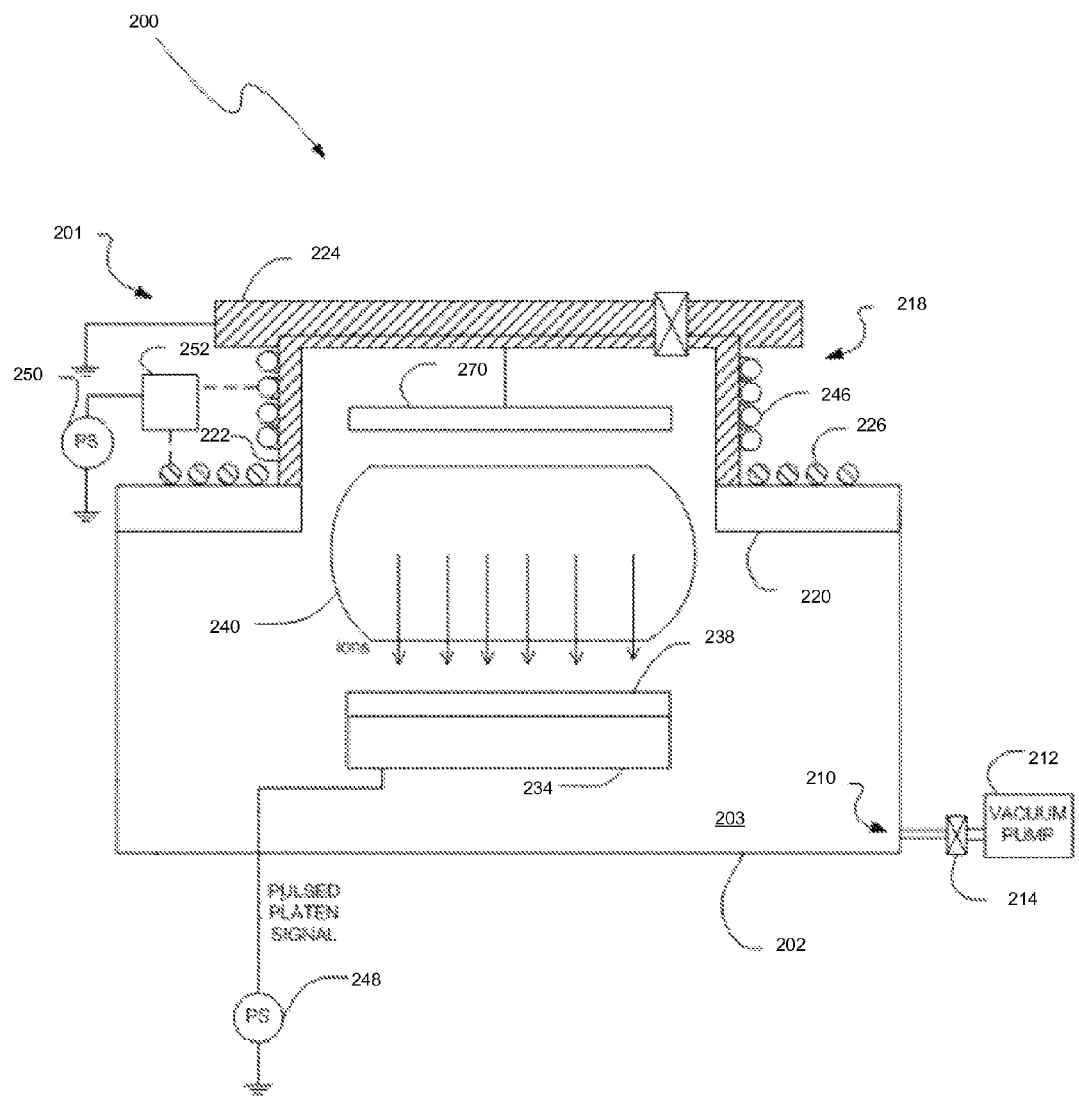
FIG. 2 represents a plasma immersion ion implanter.

As stated above, the amassing of particles on the workpiece support, such as a platen, can be detrimental to the ion implantation process. The time required cleaning these particles from the workpiece support and cost of ownership is substantially reduced through the use of the in-situ cleaning method disclosed herein.

A workpiece having a coating of a suitable material deposited on its bottom surface is brought into contact with the workpiece support, such as the electrostatic chuck. In the preferred embodiment, this workpiece is a semiconductor wafer, which is loaded into the vacuum chamber via the traditional entry path using a FOUP. In this way, the coating is brought into contact with not only the chuck, but also other surfaces of the wafer handling system.

In one embodiment, coatings such as deposited glasses, doped glasses and nitrides may be employed. These coatings may be slightly tacky. In other embodiments, the coating is softer than the surface that it is intended to clean. In other embodiment, the coating may retain electrostatic charge.

In another embodiment, the wafer is coated on the bottom surface with photoresist. Photoresist is commonly used as part of the lithography (or pattern forming) process during semiconductor wafer fabrication. Photoresist is typically categorized as either hard-baked or soft-baked and either of these types is suitable for the present application.

In one specific embodiment, photoresist, such as is available from Shipley Company, is used. In a further embodiment, Shipley AZ photoresist is used. First, the wafer is cleaned with the nitrogen gas blower turned off. The photoresist is then applied to the wafer using a photoresist spinner. The application of photoresist is preferably performed one wafer at a time. The wafer is then baked in a convection oven at about 110° C. for about 1 minute. This baking can be performed as a batch process. This soft-baked wafer is then placed in the FOUP and used to clean the platen as described above.

In a further embodiment, after baking at 110° C., the wafer is baked again at 130°-150° C., to create a hard-baked photoresist coating. The wafer is then entered into the FOUP as described above.

In another embodiment, an oxide, such as silicon oxide is used. In a further embodiment, the silicon oxide is thermally grown on the bottom surface of the wafer.

As mentioned above, in the preferred embodiment, the specially coated wafer enters the vacuum chamber via the FOUP. It then is moved to the workpiece support. Between the FOUP and the workpiece support, the wafer is typically contacted by one or more pieces of equipment, such as robotic arms. As the wafer is passed, the special coating removes particles from each piece of equipment it contacts. When the wafer reaches the workpiece support, or chuck, it is clamped down. In most embodiments, this clamping is performed electrostatically, but can also be performed mechanically through the use of clamps or other securing mechanisms.

The act of clamping the wafer to the chuck brings them in close contact and enhances the transfer of particles from the surface of the chuck to the bottom side of the wafer. In certain embodiments, the ion implantation process is performed on this specially coated wafer. By implanting ions in the wafer, its temperature increases, which increases the stickiness of the coating. In certain embodiments, the ion implantation is performed using a specific recipe of dose and energy. In other embodiments, the implantation only serves to elevate the temperature of the wafer sufficiently to warm the coating on the bottom surface. In other embodiments, the wafer is warmed using other methods, such as heat lamps. In still other embodiments, one can modulate the clamping force or clamping sequence.

The wafer is then removed from the support, and exits the vacuum chamber in the same manner employed by standard semiconductor wafers. In certain embodiments, the surface of the chuck is best cleaned by repeating the above process a number of times. In some embodiments, 12 or more wafers are utilized, although other numbers are also within the scope of the disclosure.

While the embodiments described herein are used in conjunction with ion implantation equipment, the disclosure is not limited to this embodiment. For example, the methods described herein are equally suitable for Plasma Enhanced Chemical Vapor Deposition (PECVD), etch, Physical Vapor Deposition (PVD), and lithography.

What is claimed is:

1. A method of removing particles from the surface of a workpiece support, used to hold a workpiece, comprising:
    a. coating the bottom surface of a workpiece with a photoresist;
    b. placing said bottom surface of said workpiece onto said workpiece support;
    c. clamping said workpiece onto said workpiece support;
    d. heating said workpiece by implanting ions on said workpiece after said clamping step; and
    e. removing said workpiece.

2. The method of claim 1, wherein said workpiece comprises a semiconductor wafer.

3. The method of claim 1, wherein said clamping is performed electrostatically.

4. The method of claim 1, wherein said clamping is performed mechanically.

5. The method of claim 1, wherein said photoresist is hard baked.

6. The method of claim 1, wherein said photoresist is soft baked.

7. The method of claim 1, further comprising a plurality of workpieces, wherein said steps are repeated using said plurality of workpieces.

* * * * *